United States Patent
Han et al.

(10) Patent No.: US 10,024,915 B2
(45) Date of Patent: Jul. 17, 2018

(54) SEMICONDUCTOR DEVICES

(71) Applicant: SK hynix Inc., Icheon-si Gyeonggi-do (KR)

(72) Inventors: Dong Hee Han, Icheon-si (KR); Saeng Hwan Kim, Suwon-si (KR); In Tae Kim, Icheon-si (KR); Byoung Chul Lee, Guri-si (KR); Mun Seon Jang, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 49 days.

(21) Appl. No.: 15/267,424

(22) Filed: Sep. 16, 2016

(65) Prior Publication Data

US 2017/0336471 A1    Nov. 23, 2017

(30) Foreign Application Priority Data

May 18, 2016 (KR) .................. 10-2016-0061100

(51) Int. Cl.
G01R 31/3177    (2006.01)
G06F 13/36    (2006.01)
G01R 31/317    (2006.01)

(52) U.S. Cl.
CPC ... G01R 31/3177 (2013.01); G01R 31/31703 (2013.01); G06F 13/36 (2013.01)

(58) Field of Classification Search
CPC .......... G01R 31/3177; G01R 31/31703; G06F 13/36
See application file for complete search history.

(56) References Cited

U.S. PATENT DOCUMENTS

| 4,216,533 A * | 8/1980 | Ichimiya .......... G01R 31/31919 365/189.04 |
| 4,293,950 A * | 10/1981 | Shimizu ................. G11C 29/56 714/743 |
| 6,647,522 B1 * | 11/2003 | Nakahara .......... G01R 31/2891 714/720 |
| 7,365,557 B1 * | 4/2008 | Ong ................. G01R 31/31922 324/73.1 |
| 2002/0049943 A1 * | 4/2002 | Kobayashi ....... G01R 31/31813 714/734 |
| 2003/0031082 A1 * | 2/2003 | Sawada ................ G11C 7/1066 365/233.1 |

(Continued)

FOREIGN PATENT DOCUMENTS

KR    20010062640 A    7/2001

*Primary Examiner* — Kyle Vallecillo
(74) *Attorney, Agent, or Firm* — William Park & Associates Ltd.

(57) ABSTRACT

A semiconductor device may include an inversion control signal generation circuit, a pattern control signal generation circuit, and a data input/output (I/O) circuit. The inversion control signal generation circuit may generate an inversion control signal according to a logic level combination of bit patterns included in at least one of a first address and a second address. The pattern control signal generation circuit may generate a pattern control signal from a pre-control signal in response to the inversion control signal. In response to the pattern control signal, the data input/output (I/O) circuit may generate data signals that will be output to an internal I/O line based on data signals loaded on a local I/O line.

20 Claims, 14 Drawing Sheets

(56) References Cited

U.S. PATENT DOCUMENTS

| | | | |
|---|---|---|---|
| 2003/0200495 A1* | 10/2003 | Kohno | G01R 31/318552 714/728 |
| 2004/0015807 A1* | 1/2004 | Honjou | G01R 31/2856 257/48 |
| 2006/0133166 A1* | 6/2006 | Kikutake | G06F 11/1032 365/201 |
| 2006/0163572 A1* | 7/2006 | Jeong | G11C 29/12015 257/48 |
| 2007/0067687 A1* | 3/2007 | Ong | G01R 31/31922 714/731 |
| 2007/0079204 A1* | 4/2007 | Ong | G01R 31/31928 714/738 |
| 2009/0103376 A1* | 4/2009 | Kanda | G11C 29/1201 365/189.05 |
| 2010/0218057 A1* | 8/2010 | Maki | G11C 29/12015 714/719 |
| 2011/0251819 A1* | 10/2011 | Ong | G01R 31/31928 702/120 |
| 2012/0226951 A1* | 9/2012 | Negishi | G11C 29/56004 714/718 |
| 2013/0238955 A1 | 9/2013 | D'Abreu et al. | |
| 2016/0003904 A1* | 1/2016 | Ong | G01R 31/3193 714/733 |

\* cited by examiner

TM<1:5>='00001'
TPH_PRE<1:8>='11001100'

| XADD<2> | XADD<1> | WORD LINE | RVS | TPH_CNT<1:8> |
|---------|---------|-----------|-----|--------------|
| L | L | WL1 | H | 00110011 |
| L | H | WL2 | L | 11001100 |
| H | L | WL3 | H | 00110011 |
| H | H | WL4 | L | 11001100 |

FIG.9

TM<1:5>='00010'
TPH_PRE<1:8>='11001100'

| XADD<2> | XADD<1> | WORD LINE | RVS | TPH_CNT<1:8> |
|---|---|---|---|---|
| L | L | WL1 | H | 00110011 |
| L | H | WL2 | H | 00110011 |
| H | L | WL3 | L | 11001100 |
| H | H | WL4 | L | 11001100 |

FIG.10

TM<1:5>='00100'
TPH_PRE<1:8>='11001100'

| YADD | YI | RVS | TPH_CNT<1:8> |
|------|------|-----|--------------|
| L | YI<1> | L | 11001100 |
| H | YI<2> | H | 00110011 |

FIG.11

TM<1:5>='01000'
TPH_PRE<1:8>='11001100'
TADD<2>='L'  TADD<1>='H'

| XADD<2> | XADD<1> | WORD LINE | RVS | TPH_CNT<1:8> |
|---|---|---|---|---|
| L | L | WL1 | L | 11001100 |
| L | H | WL2 | H | 00110011 |
| H | L | WL3 | L | 11001100 |
| H | H | WL4 | L | 11001100 |

| TM<5> | YADD | SEL<1> | SEL<2> | SEL<3> | TPH_PRE<1:8> |
|---|---|---|---|---|---|
| L | X | L | L | H | TPH_DQ<1:8> bypass |
| H | H | H | L | L | SEL_CNT<1>='H'<br>→ 1st pattern combination |
| H | L | L | H | L | SEL_CNT<2>='H'<br>→ 2nd pattern combination |

SEMICONDUCTOR DEVICES

CROSS-REFERENCE TO RELATED APPLICATIONS

The present application claims priority under 35 U.S.C 119(a) to Korean Patent Application No. 10-2016-0061100 filed on May 18, 2016, which is incorporated herein by reference in its entirety.

BACKGROUND

1. Technical Field

Embodiments of the present disclosure generally relate to integrated circuits, and more particularly to semiconductor devices generating test data patterns.

2. Related Art

Semiconductor devices operating with double data rate (DDR) transfers data on both the rising and falling edges of clock signals to increase their data rate. Extensions of this technique include, for example, a double data rate second generation (DDR2) standard and a double data rate third generation (DDR3) standard providing four bit data transfers or eight bit data transfers per cycle. However, an increase in data rate may result in an increase in bit error rate. Therefore, many techniques are being used to tolerate high error rates and to improve the reliability of data transmission.

One of the techniques is to generate codes capable of detecting occurrence of errors and/or correcting errors and transmit the codes with the data being transmitted to improve the reliability of data transmission. For example, an error detection code (EDC) may detect errors, and an error correction code (ECC) may correct the errors and restore the original data.

SUMMARY

According to an embodiment, a semiconductor device may include an inversion control signal generation circuit, a pattern control signal generation circuit, and a data input/output (I/O) circuit. The inversion control signal generation circuit may generate an inversion control signal according to a logic level combination of bit patterns included in at least one of a first address and a second address. The pattern control signal generation circuit may generate a pattern control signal from a pre-control signal in response to the inversion control signal. The data input/output (I/O) circuit may generate data signals that will be output to an internal I/O line based on data loaded on a local I/O line.

According to another embodiment, a semiconductor device may include a pre-control signal generation circuit, a pattern control signal generation circuit, and a data input/output (I/O) circuit. The pre-control signal generation circuit may receive and hold bit pattern combinations input through a test pattern signal in response to a selection control signal, and may output the bit pattern combinations as a pre-control signal in response to an address. The pattern control signal generation circuit may generate a pattern control signal from the pre-control signal in response to an inversion control signal. The data input/output (I/O) circuit configured to, in response to the pattern control signal, generate data signals that will be output to an internal I/O line based on data loaded on a local I/O line.

BRIEF DESCRIPTION OF THE DRAWINGS

Various embodiments of the present disclosure will become more apparent in view of the attached drawings and accompanying detailed description, in which:

FIGS. 8 to 12 are tables illustrating example operations of the semiconductor device illustrated in FIG. 1;

DETAILED DESCRIPTION

Various embodiments of the present disclosure will be described hereinafter with reference to the accompanying drawings. However, the embodiments described herein are for illustrative purposes only and are not intended to limit the scope of the present disclosure.

Figure 1:
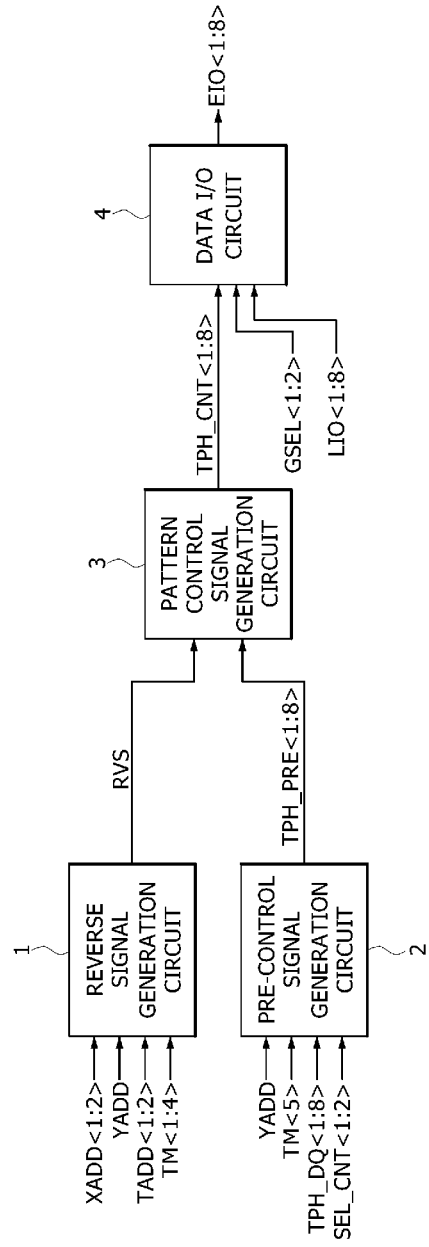
FIG. 1 is a diagram illustrating a example configuration of a semiconductor device according to an embodiment.

As illustrated in FIG. 1, a semiconductor device according to an embodiment may include an inversion control signal generation circuit 1, a pre-control signal generation circuit 2, a pattern control signal generation circuit 3, and a data input/output (I/O) circuit 4.

The inversion control signal generation circuit 1 may generate an inversion control signal RVS in response to first and second row addresses XADD<1:2>, a column address YADD, first and second target addresses TADD<1:2>, and first to fourth test mode signals TM<1:4>. The first test mode signal TM<1> may be enabled to put the semiconductor device in a first test mode, and the second test mode signal TM<2> may be enabled to put the semiconductor device in a second test mode. In addition, the third test mode signal TM<3> may be enabled to put the semiconductor device in a third test mode, and the fourth test mode signal TM<4> may be enabled to put the semiconductor device in a fourth test mode. The inversion control signal generation circuit 1 may generate the inversion control signal RVS according to a logic level combination of bit patterns included in the first and second row addresses XADD<1:2> in the first and second test modes. The inversion control signal generation circuit 1 may generate the inversion control signal RVS according to a logic level of the column address YADD in the third test mode. The inversion control signal generation circuit 1 may compare the first and second row addresses XADD<1:2> with the first and second target addresses TADD<1:2> to generate the inversion control signal RVS in the fourth test mode. A configuration and an operation of the inversion control signal generation circuit 1 will be described in detail with reference to FIG. 2.

The pre-control signal generation circuit 2 may generate a pre-control signal TPH_PRE<1:8> in response to the column address YADD, a fifth test mode signal TM<5>, a test pattern signal TPH_DQ<1:8>, and first and second selection control signals SEL_CNT<1:2>. The test pattern signal TPH_DQ<1:8> may be a signal that is applied from an external device or stored in the semiconductor device. A test mode signal may be a signal that is enabled to put the semiconductor device in a test mode. For example, the fifth test mode signal TM<5> may be a signal that is enabled to put the semiconductor device in a fifth test mode. The pre-control signal generation circuit 2 may receive first and second bit-pattern combinations input through the test pattern signal TPH_DQ<1:8> to hold (e.g., latch) the first and second bit-pattern combinations in response to the first and second selection control signals SEL_CNT<1:2>, and may output the latched first and second bit-pattern combinations as the pre-control signal TPH_PRE<1:8> in response to the column address YADD, in the fifth test mode. An example configuration and an example operation of the pre-control signal generation circuit 2 will be described in detail with reference to FIGS. 3 to 5.

The pattern control signal generation circuit 3 may generate a pattern control signal TPH_CNT<1:8> from the pre-control signal TPH_PRE<1:8> in response to the inversion control signal RVS. If the inversion control signal RVS is enabled, the pattern control signal generation circuit 3 may invert the pre-control signal TPH_PRE<1:8> to output an inverted pre-control signal as the pattern control signal TPH_CNT<1:8>. If the inversion control signal RVS is disabled, the pattern control signal generation circuit 3 may buffer the pre-control signal TPH_PRE<1:8> to output the buffered pre-control signal as the pattern control signal TPH_CNT<1:8>. An example configuration and an example operation of the pattern control signal generation circuit 3 will be described in detail with reference to FIG. 6.

The data I/O circuit 4 may drive an internal I/O line EIO<1:8> in response to first and second drive selection signals GSEL<1:2> and the pattern control signal TPH_CNT<1:8>. For example, based on data signals loaded on a local I/O line LIO<1:8>, the data I/O circuit 4 may generate data signals that will be output to the internal I/O line EIO<1:8>. An example configuration and an example operation of the data I/O circuit 4 will be described in detail with reference to FIG. 7.

Figure 2:
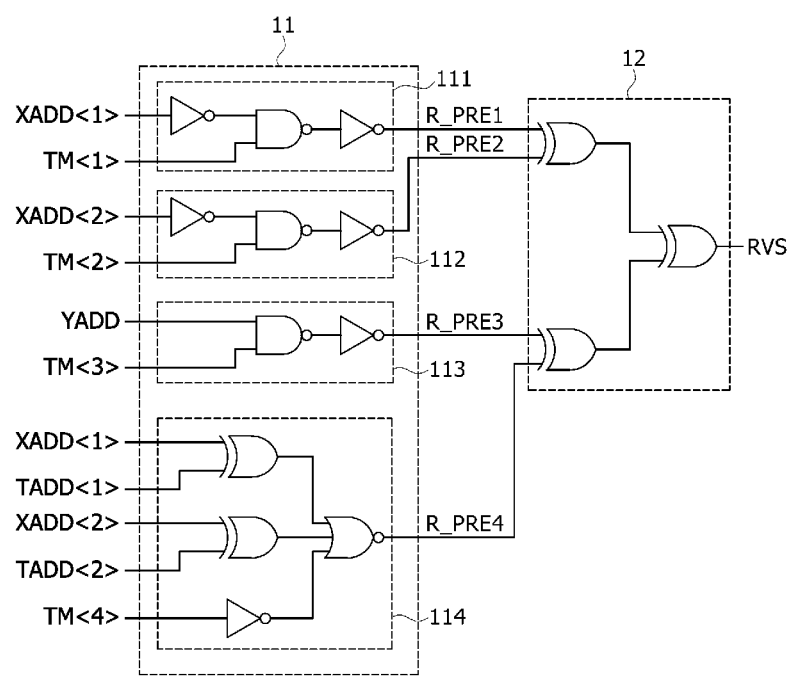
FIG. 2 is a diagram illustrating an example of an inversion control signal generation circuit included in the semiconductor device of FIG. 1.

Referring to FIG. 2, the inversion control signal generation circuit 1 may include a pre-inversion control signal generation circuit 11 and an inversion control signal output circuit 12. The pre-inversion-control signal generation circuit 11 may include a first pre-inversion-control signal generation circuit 111, a second pre-inversion-control signal generation circuit 112, a third pre-inversion-control signal generation circuit 113, and a fourth pre-inversion-control signal generation circuit 114.

The first pre-inversion-control signal generation circuit 111 may generate a first pre-inversion-control signal R_PRE1 from the first row address XADD<1> in response to the first test mode signal TM<1>. Here, the first pre-inversion-control signal R_PRE1 may be enabled (e.g., a logic "high" level) if the first row address XADD<1> having a logic "low" level is input to the first pre-inversion-control signal generation circuit 111 in the first test mode.

The second pre-inversion-control signal generation circuit 112 may generate a second pre-inversion-control signal R_PRE2 from the second row address XADD<2> in response to the second test mode signal TM<2>. Here, the second pre-inversion-control signal R_PRE2 may be enabled ((e.g., a logic "high" level) if the second row address XADD<2> having a logic "low" level is input to the second pre-inversion-control signal generation circuit 112 in the second test mode.

The third pre-inversion-control signal generation circuit 113 may generate a third pre-inversion-control signal R_PRE3 from the column address YADD in response to the third test mode signal TM<3>. Here, the third pre-inversion-control signal R_PRE3 may be enabled (e.g., a logic "high" level) if the column address YADD having a logic "high" level is input to the third pre-inversion-control signal generation circuit 113 in the third test mode.

In response to the fourth test mode signal TM<4>, the fourth pre-inversion-control signal generation circuit 114 may compare the first and second row addresses XADD<1:2> with the first and second target addresses TADD<1:2> to generate a fourth pre-inversion-control signal R_PRE4. Here, the fourth pre-inversion-control signal R_PRE4 may be enabled (e.g., a logic "high" level) if the first and second row addresses XADD<1:2> have the same logic level combination as the first and second target addresses TADD<1:2> in the fourth test mode.

The inversion control signal output circuit 12 may generate the inversion control signal RVS in response to the first to fourth pre-inversion control signals R_PRE1, R_PRE2, R_PRE3, and R_PRE4. Here, the inversion control signal RVS may be enabled (e.g., a logic "high" level) if any one of the first to fourth pre-inversion-control signals R_PRE1, R_PRE2, R_PRE3 and R_PRE4 is enabled to have a logic "high" level.

The inversion control signal generation circuit 1 in accordance with an embodiment may generate the inversion control signal RVS. The inversion control signal RVS may be enabled (e.g., a logic "high" level) if the first row address XADD<1> having a logic "low" level is input to the inversion control signal generation circuit 1 in the first test mode. The inversion control signal RVS may be enabled (e.g., a logic "high" level) if the second row address XADD<2> having a logic "low" level is input to the inversion control signal generation circuit 1 in the second test mode. In addition, The inversion control signal RVS may be enabled (e.g., a logic "high" level) if the column address YADD having a logic "high" level is input to the inversion control signal generation circuit 1 in the third test mode. The inversion control signal RVS may be enabled to have a logic "high" level if the first and second row addresses XADD<1:2> have the same logic level combination as the first and second target addresses TADD<1:2> in the fourth test mode.

Figure 3:
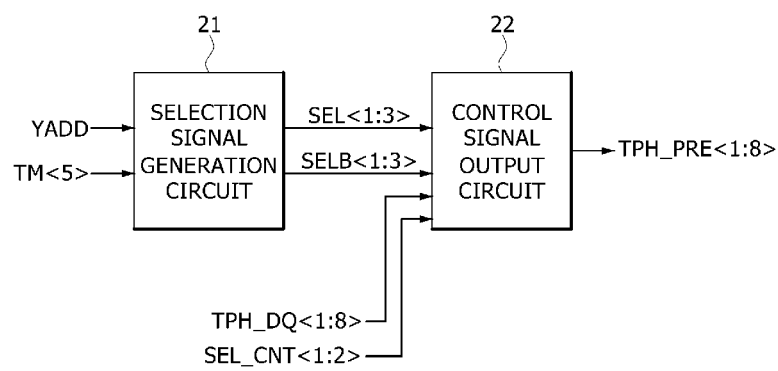
FIG. 3 is a diagram illustrating an example configuration of a pre-control signal generation circuit included in the semiconductor device of FIG. 1.

Referring to FIG. 3, the pre-control signal generation circuit 2 may include a selection signal generation circuit 21 and a control signal output circuit 22.

The selection signal generation circuit 21 may generate first to third selection signals SEL<1:3> and first to third inverted selection signals SELB<1:3> in response to the fifth test mode signal TM<5> and the column address YADD. The fifth test mode signal TM<5> may be enabled to put the semiconductor device in the fifth test mode. The selection signal generation circuit 21 may generate the first selection signal SEL<1> and the first inverted selection signal SELB<1>, which are enabled if the column address YADD having a predetermined first logic level is input to the selection signal generation circuit 21 in the fifth test mode. For example, the second selection signal SEL<2> and the second inverted selection signal SELB<2> may be enabled if the column address YADD having a predetermined second logic level is input to the selection signal generation circuit 21 in the fifth test mode. The selection signal generation circuit 21 may generate the third selection signal SEL<3> and the third inverted selection signal SELB<3>, which are enabled when the semiconductor device is not in the fifth test mode.

The control signal output circuit 22 may receive and hold (e.g., latch) the first and second bit-pattern combinations input through the test pattern signal TPH_DQ<1:8> in response to the first and second selection control signals SEL_CNT<1:2>, and may output the latched first and second bit-pattern combinations as the pre-control signal TPH_PRE<1:8> in response to the first to third selection signals SEL<1:3> and the first to third inverted selection signals SELB<1:3>. The control signal output circuit 22 may latch the first bit-pattern combination input through the test pattern signal TPH_DQ<1:8> if the first selection control signal SEL_CNT<1> is enabled. The control signal output circuit 22 may latch the second bit-pattern combination input through the test pattern signal TPH_DQ<1:8> if the second selection control signal SEL_CNT<2> is enabled. The control signal output circuit 22 may output the latched first bit-pattern combination as the pre-control signal TPH_PRE<1:8> if the first selection signal SEL<1> and the first inverted selection signal SELB<1> are enabled. The control signal output circuit 22 may output the latched second bit-pattern combination as the pre-control signal TPH_PRE<1:8> if the second selection signal SEL<2> and the second inverted selection signal SELB<2> are enabled. The control signal output circuit 22 may buffer the test pattern signal TPH_DQ<1:8> to output the buffered test pattern signal as pre-control signal TPH_PRE<1:8> if the third selection signal SEL<3> and the third inverted selection signal SELB<3> are enabled.

Figure 4:
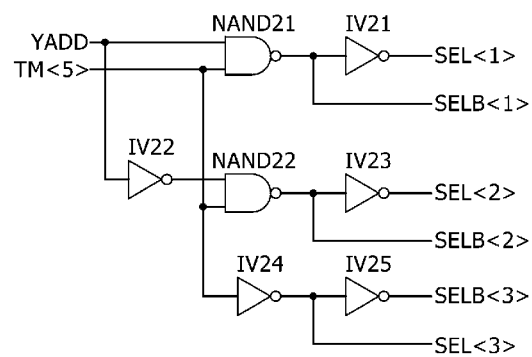
FIG. 4 is a diagram illustrating an example of a selection signal generation circuit included in the pre-control signal generation circuit of FIG. 3.

Referring to FIG. 4, the selection signal generation circuit 21 may include NAND gates NAND21 and NAND22 as well as inverters IV21, IV22, IV23, IV24, and IV25. The semiconductor may enter the fifth test mode if the fifth test mode signal TM<5> has a logic "high" level, and may exit the fifth test mode if the fifth test mode signal TM<5> has a logic "low" level. The selection signal generation circuit 21 may generate the first selection signal SEL<1> enabled to have a logic "high" level and the first inverted selection signal SELB<1> enabled to have a logic "low" level if the column address YADD having a logic "high" level is input to the selection signal generation circuit 21 in the fifth test mode. The selection signal generation circuit 21 may generate the second selection signal SEL<2> enabled to have a logic "high" level and the second inverted selection signal SELB<2> enabled to have a logic "low" level if the column address YADD having a logic "low" level is input to the selection signal generation circuit 21 in the fifth test mode. The selection signal generation circuit 21 may generate the third selection signal SEL<3> enabled to have a logic "high" level and the third inverted selection signal SELB<3> enabled to have a logic "low" level when the semiconductor device is not in the fifth test mode.

Figure 5:
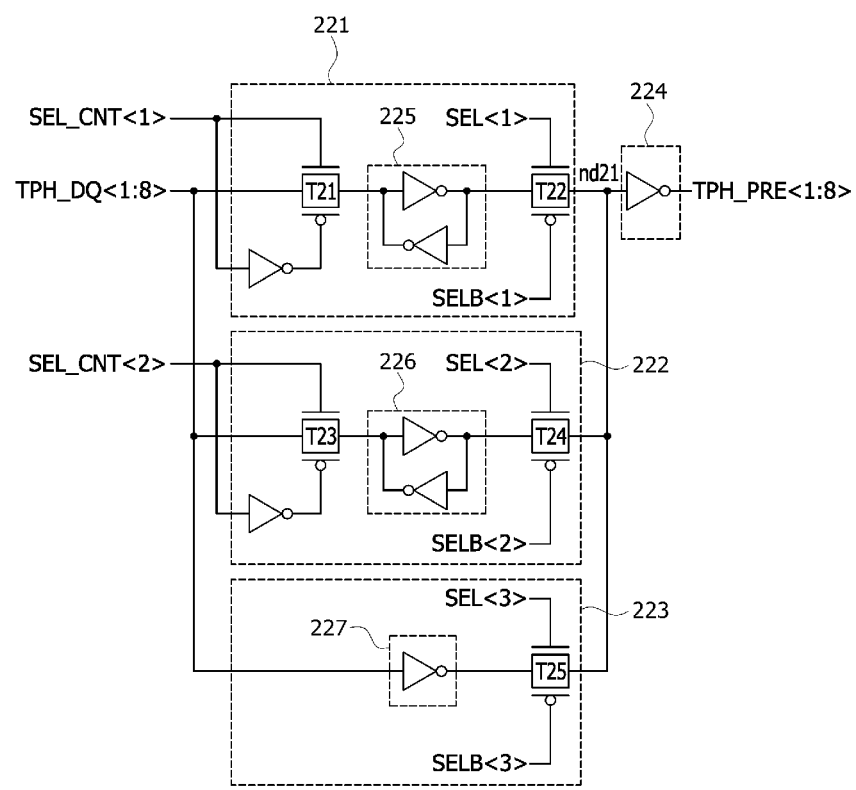
FIG. 5 is a diagram illustrating an example of a control signal output circuit included in the pre-control signal generation circuit of FIG. 3.

Referring to FIG. 5, the control signal output circuit 22 may include a first bit-pattern combination storage circuit 221, a second bit-pattern combination storage circuit 222, a bypass circuit 223, and an output buffer 224.

The first bit-pattern combination storage circuit 221 may include a first transmission gate T21, a first latch circuit 225, and a second transmission gate T22. The test pattern signal TPH_DQ<1:8> including the first bit-pattern combination may be input to the first bit-pattern combination storage circuit 221 through the first transmission gate T21 turned on by the first selection control signal SEL_CNT<1> enabled to have a logic "high" level, and the first latch circuit 225 may latch the first bit-pattern combination. The first bit-pattern combination latched by the first latch circuit 225 may be output to a node nd21 through the second transmission gate T22 which is turned on by the first selection signal SEL<1> enabled to have a logic "high" level and the first inverted selection signal SELB<1> enabled to have a logic "low" level.

The second bit-pattern combination storage circuit 222 may include a third transmission gate T23, a second latch circuit 226, and a fourth transmission gate T24. The test pattern signal TPH_DQ<1:8> including the second bit-pattern combination may be input to the second bit-pattern combination storage circuit 222 through the third transmission gate T23 turned on by the second selection control signal SEL_CNT<2> enabled to have a logic "high" level, and the second latch circuit 226 may latch the second bit-pattern combination. The second bit-pattern combination latched by the second latch circuit 226 may be output to the node nd21 through the fourth transmission gate T24 which is turned on by the second selection signal SEL<2> enabled to have a logic "high" level and the second inverted selection signal SELB<2> enabled to have a logic "low" level.

The bypass circuit 223 may include an input buffer 227 and a fifth transfer gate T25. The test pattern signal TPH_DQ<1:8> buffered by the input buffer 227 may be output to the node nd21 through the fifth transfer gate T25 which is turned on by the third selection signal SEL<3> enabled to have a logic "high" level and the third inverted selection signal SELB<3> enabled to have a logic "low" level.

The output buffer 224 may buffer (e.g., invert) a signal passing through the node nd21 to output the buffered signal as the pre-control signal TPH_PRE<1:8>. The output buffer 224 may buffer (e.g., invert) the first bit-pattern combination latched by the first latch circuit 225 to output the buffered first bit-pattern combination as the pre-control signal TPH_PRE<1:8> while the first selection signal SEL<1> is being enabled (e.g., a logic "high" level) and the first inverted selection signal SELB<1> is being enabled (e.g., a logic "low" level). The output buffer 224 may buffer (e.g., invert) the second bit-pattern combination latched by the second latch circuit 226 to output the buffered second bit-pattern combination as the pre-control signal TPH_PRE<1:8> while the second selection signal SEL<2> is being enabled (e.g., a logic "high" level) and the second inverted selection signal SELB<2> is enabled (e.g. a logic "low" level). The output buffer 224 may buffer (e.g., invert) the test pattern signal TPH_DQ<1:8> to output the buffered test pattern signal as the pre-control signal TPH_PRE<1:8> while the third selection signal SEL<3> is being enabled (e.g., a logic "high" level) and the third inverted selection signal SELB<3> is enabled (e.g., a logic "low" level).

Figure 6:
FIG. 6 is a diagram illustrating an example of a pattern control signal generation circuit included in the semiconductor device of FIG. 1.

Referring to FIG. 6, the pattern control signal generation circuit 3 may include an exclusive OR gate XOR31 that executes an exclusive OR operation on the inversion control signal RVS and the pre-control signal TPH_PRE<1:8> to generate the pattern control signal TPH_CNT<1:8>. The pattern control signal generation circuit 3 may invert the pre-control signal TPH_PRE<1:8> to output the inversely buffered pre-control signal as the pattern control signal TPH_CNT<1:8> if the inversion control signal RVS is enabled to have a logic "high" level. The pattern control signal generation circuit 3 may buffer the pre-control signal TPH_PRE<1:8> (e.g., maintain the phase of the pre-control signal TPH_PRE<1:8>) to output the buffered pre-control signal as the pattern control signal TPH_CNT<1:8> if the inversion control signal RVS is disabled to have a logic "low" level.

Figure 7:
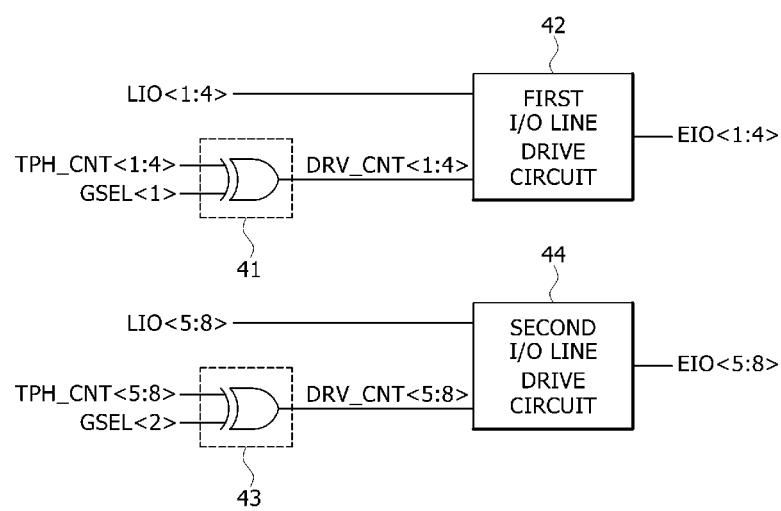
FIG. 7 is a diagram illustrating an example configuration of a data input/output circuit included in the semiconductor device of FIG. 1.

Referring to FIG. 7, the data I/O circuit 4 may include a first drive control signal generation circuit 41, a first I/O line drive circuit 42, a second drive control signal generation circuit 43, and a second I/O line drive circuit 44.

The pattern control signal TPH_CNT<1:8> may be divided into a first pattern control signal TPH_CNT<1:4> and a second pattern control signal TPH_CNT<5:8>. The first drive control signal generation circuit 41 may generate a first drive control signal DRV_CNT<1:4> from a first pattern control signal TPH_CNT<1:4> in response to the first drive selection signal GSEL<1>. The first drive control signal generation circuit 41 may invert the first pattern control signal TPH_CNT<1:4> to generate the first drive control signal DRV_CNT<1:4> if the first drive selection signal GSEL<1> has a logic "high" level. The first drive control signal generation circuit 41 may buffer the first pattern control signal TPH_CNT<1:4> (e.g., maintain a logic level combination of the first pattern control signal TPH_CNT<1:4>) to generate the first drive control signal DRV_CNT<1:4> if the first drive selection signal GSEL<1> has a logic "low" level.

The local I/O line LIO<1:8> may be divided into a first local I/O line LIO<1:4> and a second local I/O line LIO<5:8>. The internal I/O line EIO<1:8> may be divided into a first internal I/O line EIO<1:4> and a second internal I/O line EIO<5:8>. The first I/O line drive circuit 42 may drive the first internal I/O line EIO<1:4> in response to the first drive control signal DRV_CNT<1:4>. For example, based on data signals loaded on the first local I/O line LIO<1:4>, the first I/O line drive circuit 42 may generate data signals that will be output to the first internal I/O line EIO<1:4>. The first I/O line drive circuit 42 may invert the data loaded on the first local I/O line LIO<1:4> to output the inverted data through the first internal I/O line EIO<1:4> according to a logic level combination of the first drive control signal DRV_CNT<1:4>. For example, if the first drive control signal DRV_CNT<1:4> has a logic level combination of '0010' and the data loaded on the first local I/O line LIO<1:4> have a logic level combination of '1111,' the first I/O line drive circuit 42 may drive the first internal I/O line EIO<1:4> so that only a level of a third bit among bits included in the data on the first local I/O line LIO<1:4> is inverted. That is, the first I/O line drive circuit 42 may output data having a logic level combination of '1101' through the first internal I/O line EIO<1:4>.

The second drive control signal generation circuit 43 may generate the second drive control signal DRV_CNT<5:8> from the second pattern control signal TPH_CNT<5:8> in response to the second drive selection signal GSEL<2>. The second drive control signal generation circuit 43 may invert the second pattern control signal TPH_CNT<5:8> to generate the second drive control signal DRV_CNT<5:8> if the second drive selection signal GSEL<2> has a logic "high" level. The second drive control signal generation circuit 43 may buffer the second pattern control signal TPH_CNT<5:8> to generate the second drive control signal DRV_CNT<5:8> if the second drive selection signal GSEL<2> has a logic "low" level.

The second I/O line drive circuit 44 may drive the second internal I/O line EIO<5:8> in response to the second drive control signal DRV_CNT<5:8>. For example, based on the data loaded on the second local I/O line LIO<5:8>, the second I/O line drive circuit 44 may generate data signals that will be output to the second internal I/O line EIO<5:8>. The second I/O line drive circuit 44 may invert the data loaded on the second local I/O line LIO<5:8> to output the inverted data through the second internal I/O line EIO<5:8> according to a logic level combination of the second drive control signal DRV_CNT<5:8>. For example, if the second drive control signal DRV_CNT<5:8> has a logic level combination of '0100' and the data loaded on the second local I/O line LIO<5:8> have a logic level combination of '1111,' the second I/O line drive circuit 44 may drive the second internal I/O line EIO<5:8> so that only a level of a second bit among bits included in the data on the second local I/O line LIO<5:8> is inverted. That is, the second I/O line drive circuit 44 may output data having a logic level combination of '1011' through the second internal I/O line EIO<5:8>.

Operations of the semiconductor device having the aforementioned configuration in the first to fifth test modes will be described hereinafter with reference to FIGS. 8 to 12 under the assumption that the test pattern signal TPH_DQ<1:8> has a logic level combination of '11001100.'

Referring to FIG. 8, if only the first test mode signal TM<1> among the first to fifth test mode signals TM<1:5> has a logic "high" level, the first test mode may be activated and the pre-control signal TPH_PRE<1:8> may be generated by buffering the test pattern signal TPH_DQ<1:8>. Thus, the pre-control signal TPH_PRE<1:8>may have the same logic level combination as the test pattern signal TPH_DQ<1:8>. That is, the pre-control signal TPH_PRE<1:8> may have a logic level combination of '11001100.' In the first test mode, the inversion control signal RVS may be enabled to have a logic "high" level only if the first row address XADD<1> has a logic "low" level. When first and third word lines WL1 and WL3 are selected, the inversion control signal RVS may be enabled to have a logic "high" level because the first row address XADD<1> has a logic "low" level, and the pattern control signal TPH_CNT<1:8> may have a logic level combination of '00110011' because the pattern control signal TPH_CNT<1:8> is generated by inverting the pre-control signal TPH_PRE<1:8>. When second and fourth word lines WL2 and WL4 are selected, the inversion control signal RVS may be disabled to have a logic "low" level because the first row address XADD<1> has a logic "high" level, and the pattern control signal TPH_CNT<1:8> may have a logic level combination of '11001100' because the pattern control signal TPH_CNT<1:8> is generated by buffering the pre-control signal TPH_PRE<1:8> (e.g., by maintaining a logic level combination of the pre-control signal TPH_PRE<1:8>).

Referring to FIG. 9, if only the second test mode signal TM<2> among the first to fifth test mode signals TM<1:5> has a logic "high" level, the second test mode may be activated, and the pre-control signal TPH_PRE<1:8> may be generated by buffering the test pattern signal TPH_DQ<1:8>. Thus, the pre-control signal TPH_PRE<1:8> may have the same logic level combination as the test pattern signal TPH_DQ<1:8>. That is, the pre-control signal TPH_PRE<1:8> may have a logic level combination of '11001100.' In the second test mode, the inversion control signal RVS may be enabled to have a logic "high" level only if the second row address XADD<2> has a logic "low" level. When the first and second word lines WL1 and WL2 are selected, the inversion control signal RVS may be enabled to have a logic "high" level because the second row address XADD<2> has a logic "low" level, and the pattern control signal TPH_CNT<1:8> may have a logic level combination of '00110011' because the pattern control signal TPH_CNT<1:8> is generated by inverting the pre-control signal TPH_PRE<1:8>. When the third and fourth word lines WL3 and WL4 are selected, the inversion control signal RVS may be disabled to have a logic "low" level because the second row address XADD<2> has a logic "high" level, and the pattern control signal TPH_CNT<1:8> may have a logic level combination of '11001100' because the pattern control signal TPH_CNT<1:8> is generated by buffering the pre-control signal TPH_PRE<1:8> (e.g., by maintaining a logic level combination of the pre-control signal TPH_PRE<1:8>).

Referring to FIG. 10, if only the third test mode signal TM<3> among the first to fifth test mode signals TM<1:5> has a logic "high" level, the third test mode may be activated and the pre-control signal TPH_PRE<1:8> may be generated by buffering the test pattern signal TPH_DQ<1:8>. Thus, the pre-control signal TPH_PRE<1:8> may have the same logic level combination as the test pattern signal TPH_DQ<1:8>. That is, the pre-control signal TPH_PRE<1:8> may have a logic level combination of '11001100.' In the third test mode, the inversion control signal RVS may be enabled to have a logic "high" level only if the column address YADD has a logic "high" level. When a first output selection signal YI<1> enabled to receive or output data through a first I/O line (not illustrated) is selected, the inversion control signal RVS may be disabled to have a logic "low" level because the column address YADD has a logic "low" level, and the pattern control signal TPH_CNT<1:8> may have a logic level combination of '11001100' because the pattern control signal TPH_CNT<1:8> is generated by buffering the pre-control signal TPH_PRE<1:8>. When a second output selection signal YI<2> enabled to receive or output data through a second I/O line (not shown) is selected, the inversion control signal RVS may be enabled to have a logic "high" level because the column address YADD has a logic "high" level, and the pattern control signal TPH_CNT<1:8> may have a logic level combination of '00110011' because the pattern control signal TPH_CNT<1:8> is generated by inverting the pre-control signal TPH_PRE<1:8>.

Referring to FIG. 11, if only the fourth test mode signal TM<4> among the first to fifth test mode signals TM<1:5> has a logic "high" level, the fourth test mode may be activated, and the pre-control signal TPH_PRE<1:8> may be generated by buffering the test pattern signal TPH_DQ<1:8>. Thus, the pre-control signal TPH_PRE<1:8> may have the same logic level combination as the test pattern signal TPH_DQ<1:8>. That is, the pre-control signal TPH_PRE<1:8> may have a logic level combination of '11001100.' In the fourth test mode, the inversion control signal RVS may be enabled to have a logic "high" level only if a logic level combination of the first and second row addresses XADD<1:2> is consistent with a logic level combination of the first and second target addresses TADD<1:2>. When the second word line WL2 is selected while the first target address TADD<1> has a logic "high" level and the second target address TADD<2> has a logic "low" level, the inversion control signal RVS may be enabled to have a logic "high" level because a logic level combination of the first and second row addresses XADD<1:2> is consistent with a logic level combination of the first and second target addresses TADD<1:2>, and the pattern control signal TPH_CNT<1:8> may have a logic level combination of '00110011' because the pattern control signal TPH_CNT<1:8> is generated by inverting the pre-control signal TPH_PRE<1:8>. When the first, third and fourth word lines WL1, WL3 and WL4 are selected while the first target address TADD<1> has a logic "high" level and the second target address TADD<2> has a logic "low" level, the inversion control signal RVS may be disabled to have a logic "low" level because a logic level combination of the first and second row addresses XADD<1:2> is inconsistent with a logic level combination of the first and second target addresses TADD<1:2>, and the pattern control signal TPH_CNT<1:8> may have a logic level combination of '11001100' because the pattern control signal TPH_CNT<1:8> is generated by buffering the pre-control signal TPH_PRE<1:8> (e.g., by maintaining a logic level combination of the pre-control signal TPH_PRE<1:8>).

Referring to FIG. 12, if the fifth test mode signal TM<5> has a logic "low" level, the fifth test mode may be inactivated, and both of the third selection signal SEL<3> and the third inverted selection signal SELB<3> may be enabled to buffer and bypass the test pattern signal TPH_DQ<1:8> through the bypass circuit 223 and to output the buffered test pattern signal as the pre-control signal TPH_PRE<1:8> (see FIGS. 4 and 5). If the column address YADD has a logic "high" level while only the fifth test mode signal TM<5> among the first to fifth test mode signals TM<1:5> has a logic "high" level to activate the fifth test mode, both of the first selection signal SEL<1> and the first inverted selection signal SELB<1> may be enabled to output the first pattern combination latched by the first selection control signal SEL_CNT<1> as the pre-control signal TPH_PRE<1:8>. If the column address YADD has a logic "low" level while the fifth test mode signal TM<5> has a logic "high" level to activate the fifth test mode, both of the second selection signal SEL<2> and the second inverted selection signal SELB<2> may be enabled to output the second pattern combination latched by the second selection control signal SEL_CNT<2> as the pre-control signal TPH_PRE<1:8>.

Figure 13:
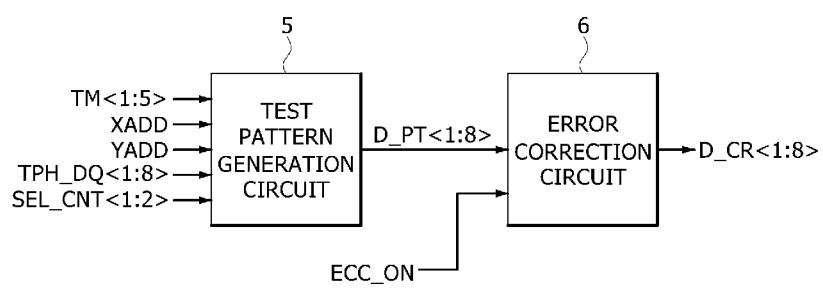
FIG. 13 is a diagram illustrating an example configuration of a semiconductor device according to an embodiment.

As illustrated in FIG. 13, a semiconductor device according to an embodiment may include a test pattern generation circuit 5 and an error correction circuit 6.

The test pattern generation circuit 5 may generate pattern data D_PT<1:8> in response to first to fifth test mode signals TM<1:5>, a row address XADD, a column address YADD, a test pattern signal TPH_DQ<1:8>, and first and second selection control signals SEL_CNT<1:2>. A configuration and an operation of the test pattern generation circuit 5 may be similar to those of the semiconductor device described with reference to FIG. 1. Thus, a detailed description of the test pattern generation circuit 5 will be omitted hereinafter.

The error correction circuit 6 may correct errors included in the pattern data D_PT<1:8> to generate corrected data D_CR<1:8> in response to an operation start signal ECC_ON. The error correction circuit 6 may correct the errors included in the pattern data D_PT<1:8> using an error correction code ECC scheme if the operation start signal ECC_ON is enabled.

Figure 14:
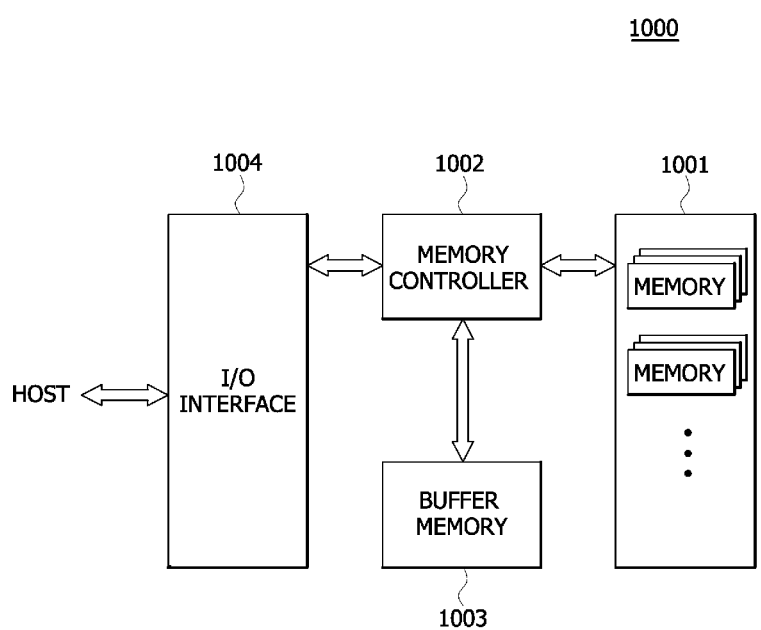
FIG. 14 is a diagram illustrating an example configuration of an electronic system employing the semiconductor device illustrated in FIG. 1.

At least one of the semiconductor devices described with reference to FIGS. 1 to 13 may be applied to an electronic system that includes a memory system, a graphic system, a computing system, a mobile system, or the like. For example, as illustrated in FIG. 14, an electronic system 1000 according an embodiment may include a data storage circuit 1001, a memory controller 1002, a buffer memory 1003, and an input/output (I/O) interface 1004.

The data storage circuit 1001 may store data output from the memory controller 1002, or may read and output the stored data to the memory controller 1002, according to a control signal generated from the memory controller 1002. The data storage circuit 1001 may include at least one of the semiconductor devices illustrated in FIGS. 1 to 13. The data storage circuit 1001 may include a nonvolatile memory that can retain its data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command output from an external device (e.g., a host device) through the I/O interface 1004, and may decode the command output from the host device to control an operation for inputting data into the data storage circuit 1001 or the buffer memory 1003 or for outputting the data stored in the data storage circuit 1001 or the buffer memory 1003. Although FIG. 14 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store the data which are processed by the memory controller 1002. That is, the buffer memory 1003 may temporarily store the data which are output from or to be input to the data storage circuit 1001. The buffer memory 1003 may store the data, which are output from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data signals applied from the external device (i.e., the host) through the I/O interface 1004, and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

According to an embodiment of the present disclosure, a semiconductor device may generate data having bit-pattern combinations by using a selective data inversion determined by addresses, or may generate data having one of the bit-pattern combinations latched based on the addresses. Thus, if a test operation requires test data having various pattern combinations, a time necessary for generating the data may be reduced.

What is claimed is:

1. A semiconductor device comprising:
   an inversion control signal generation circuit configured to generate an inversion control signal according to a logic level combination of bit patterns included in at least one of a first address and a second address;
   a pattern control signal generation circuit configured to generate a pattern control signal from a pre-control signal in response to the inversion control signal; and
   a data input/output (I/O) circuit configured to drive an internal I/O line based on data signals loaded on a local I/O line in response to the pattern control signal,
   wherein the pattern control signal generation circuit inverts the pre-control signal to generate the pattern control signal when the inversion control signal is enabled.

2. The semiconductor device of claim 1, wherein the inversion control signal generation circuit generates the inversion control signal enabled if the bit pattern included in the first address has a predetermined logic level combination.

3. The semiconductor device of claim 1, wherein the inversion control signal generation circuit generates the inversion control signal enabled if the bit pattern included in the second address has a predetermined logic level combination.

4. The semiconductor device of claim 1, wherein the inversion control signal generation circuit is configured to generate the inversion control signal enabled if the first address includes a bit pattern having the same logic level combination as a target address.

5. The semiconductor device of claim 1, wherein the pattern control signal generation circuit inverts the pre-control signal to output the inverted signal as the pattern control signal if the inversion control signal is enabled.

6. The semiconductor device of claim 1, wherein the data input/output (I/O) circuit generates first and second drive control signals from the pattern control signal in response to first and second drive selection signals, and drives the internal I/O line based on the data loaded on the local I/O line in response to the first and second drive control signals.

7. The semiconductor device of claim 1, further comprising a pre-control signal generation circuit configured to receive and hold bit pattern combinations input through a test pattern signal in response to a selection control signal and configured to output the bit pattern combinations as the pre-control signal in response to the second address.

8. The semiconductor device of claim 7, wherein the pre-control signal generation circuit includes:
   a selection signal generation circuit configured to generate a selection signal in response to the second address; and
   a control signal output circuit configured to generate the pre-control signal from the test pattern signal in response to the selection signal and the selection control signal.

9. The semiconductor device of claim 8, wherein:
   the selection signal includes a first selection signal, a second selection signal, and a third selection signal; and
   the selection signal generation circuit generates the first selection signal enabled if the second address has a first logic level, generates the second selection signal enabled if the second address has a second logic level, and generates the third selection signal enabled while a test mode signal is disabled.

10. The semiconductor device of claim 9, wherein:
    the selection control signal includes a first selection control signal and a second selection control signal; and the control signal output circuit is configured to latch a first pattern combination input through the test pattern signal in response to the first selection control signal and configured to output the latched first pattern combination as the pre-control signal if the first selection signal is enabled.

11. The semiconductor device of claim 9, wherein:
the selection control signal includes a first selection control signal and a second selection control signal; and
the control signal output circuit configured to latch a second pattern combination input through the test pattern signal in response to the second selection control signal and configured to output the latched second pattern combination as the pre-control signal if the second selection signal is enabled.

12. The semiconductor device of claim 9, wherein the control signal output circuit buffers the test pattern signal to output the buffered signal as the pre-control signal if the third selection signal is enabled.

13. A semiconductor device comprising:
a pre-control signal generation circuit configured to receive and hold bit pattern combinations input through a test pattern signal in response to a selection control signal and configured to output the bit pattern combinations as a pre-control signal in response to an address;
a pattern control signal generation circuit configured to generate a pattern control signal from the pre-control signal in response to an inversion control signal; and
a data input/output (I/O) circuit configured to drive an internal I/O line based on data loaded on a local I/O line in response to the pattern control signal,
wherein the pattern control signal generation circuit inverts the pre-control signal to generate the pattern control signal when the inversion control signal is enabled.

14. The semiconductor device of claim 13, wherein the pre-control signal generation circuit includes:
a selection signal generation circuit configured to generate a selection signal in response to the address; and
a control signal output circuit configured to generate the pre-control signal from the test pattern signal in response to the selection signal and the selection control signal.

15. The semiconductor device of claim 14, wherein:
the selection signal includes a first selection signal, a second selection signal, and a third selection signal; and
the selection signal generation circuit generates the first selection signal enabled if the address has a first logic level, generates the second selection signal enabled if the address has a second logic level, and generates the third selection signal enabled while a test mode signal is disabled.

16. The semiconductor device of claim 15, wherein:
the selection control signal includes a first selection control signal and a second selection control signal; and
the control signal output circuit is configured to latch a first pattern combination input through the test pattern signal in response to the first selection control signal and configured to output the latched first pattern combination as the pre-control signal if the first selection signal is enabled.

17. The semiconductor device of claim 15, wherein:
the selection control signal includes a first selection control signal and a second selection control signal; and
the control signal output circuit configured to latch a second pattern combination input through the test pattern signal in response to the second selection control signal and configured to output the latched second pattern combination as the pre-control signal if the second selection signal is enabled.

18. The semiconductor device of claim 15, wherein the control signal output circuit buffers the test pattern signal to output the buffered signal as the pre-control signal if the third selection signal is enabled.

19. The semiconductor device of claim 13, wherein the pattern control signal generation circuit inverts the pre-control signal to output the inverted signal as the pattern control signal if the inversion control signal is enabled.

20. The semiconductor device of claim 13, wherein the data input/output (I/O) circuit generates first and second drive control signals from the pattern control signal in response to first and second drive selection signals, and drives the internal I/O line based on the data loaded on the local I/O line in response to the first and second drive control signals.

* * * * *